United States Patent
Bhosale et al.

(10) Patent No.: US 11,901,224 B2
(45) Date of Patent: Feb. 13, 2024

(54) REWORK FOR METAL INTERCONNECTS USING ETCH AND THERMAL ANNEAL

(71) Applicant: International Business Machines Corporation, Armonk, NY (US)

(72) Inventors: Prasad Bhosale, Albany, NY (US); Terry A. Spooner, Clifton Park, NY (US); Chih-Chao Yang, Glenmont, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/857,408

(22) Filed: Apr. 24, 2020

(65) Prior Publication Data

US 2020/0251386 A1 Aug. 6, 2020

Related U.S. Application Data

(62) Division of application No. 16/014,780, filed on Jun. 21, 2018, now Pat. No. 10,658,235.

(51) Int. Cl.
*H01L 21/768* (2006.01)
*H01L 21/67* (2006.01)
*H01L 21/66* (2006.01)

(52) U.S. Cl.
CPC .. *H01L 21/76864* (2013.01); *H01L 21/67288* (2013.01); *H01L 21/76867* (2013.01); *H01L 21/76873* (2013.01); *H01L 21/76874* (2013.01); *H01L 22/12* (2013.01)

(58) Field of Classification Search
CPC ......... H01L 21/67288; H01L 21/76844; H01L 21/76864; H01L 21/76867; H01L 21/76873; H01L 21/76874; H01L 21/76877; H01L 21/76883; H01L 22/12; H01L 22/20
See application file for complete search history.

(56) References Cited

U.S. PATENT DOCUMENTS

| | | |
|---|---|---|
| 5,011,580 A | 4/1991 | Pan et al. |
| 5,236,551 A | 8/1993 | Pan |
| 5,656,554 A | 8/1997 | Desai et al. |
| 6,028,362 A | 2/2000 | Omura |
| 6,184,137 B1 | 2/2001 | Ding et al. |
| 6,340,601 B1 | 1/2002 | Curran, Jr. et al. |
| 6,982,227 B2 | 1/2006 | Cooney, III et al. |
| 7,008,803 B2 | 3/2006 | Kane et al. |

(Continued)

OTHER PUBLICATIONS

Paul J. Otterstedt, List of IBM Patents or Patent Applications Treated as Related, May 13, 2020, pp. 1-2.

*Primary Examiner* — Matthew C Landau
*Assistant Examiner* — Dmitriy Yemelyanov
(74) *Attorney, Agent, or Firm* — L. Jeffrey Kelly; Otterstedt & Kammer PLLC (57) ABSTRACT

Metal interconnect structures are reworked to address possible voids or other defects. Etching of initially deposited interconnect metal to open voids is followed by reflow to accumulate interconnect metal at the bottoms of trenches. Additional interconnect metal is deposited over the initially deposited interconnect metal by electroplating and/or electroless plating. Additional diffusion barrier material may be deposited and patterned prior to deposition of the additional interconnect material.

7 Claims, 8 Drawing Sheets

(56) References Cited

U.S. PATENT DOCUMENTS

| | | | |
|---|---|---|---|
| 7,052,997 B2 | 5/2006 | Sandhu | |
| 9,190,285 B1 | 11/2015 | Abdallah et al. | |
| 9,418,934 B1* | 8/2016 | Briggs | H01L 21/76847 |
| 2003/0032238 A1 | 2/2003 | Kim et al. | |
| 2006/0202345 A1* | 9/2006 | Barth | H01L 23/53238 |
| | | | 257/761 |
| 2007/0284736 A1* | 12/2007 | Yang | H01L 21/76844 |
| | | | 257/E21.585 |
| 2008/0150140 A1* | 6/2008 | Furuya | H01L 21/76831 |
| | | | 257/E23.141 |
| 2013/0270703 A1* | 10/2013 | Zierath | H01L 21/76831 |
| | | | 438/653 |
| 2014/0021581 A1* | 1/2014 | Yang | H01L 23/53228 |
| | | | 257/530 |
| 2017/0170062 A1 | 6/2017 | Murray et al. | |
| 2018/0076143 A1 | 3/2018 | Yang | |
| 2018/0158781 A1* | 6/2018 | Jung | H01L 21/76847 |
| 2019/0393085 A1 | 12/2019 | Bhosale et al. | |

* cited by examiner

REWORK FOR METAL INTERCONNECTS USING ETCH AND THERMAL ANNEAL

CROSS-REFERENCE TO RELATED APPLICATION

This application is a division of U.S. patent application Ser. No. 16/014,780 filed Jun. 21, 2018, the complete disclosure of which is expressly incorporated herein by reference in its entirety for all purposes.

BACKGROUND

The present application relates generally to the electrical, electronic and computer arts and, more particularly, to the rework of metal interconnect structures.

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

Silicon-based devices typically include multiple interconnect metallization layers above a device (front-end-of-line/ FEOL) layer that contains field-effect transistors (FETs), memory devices, or other structures. Middle-of-line (MOL) processing includes steps typically used for fabricating metal contacts for logic circuitry components such as field-effect transistors (FETs), resistors, diodes, and capacitors. Back-end-of-line (BEOL) processing involves the creation of metal interconnecting wires that connect the devices formed in FEOL processing to form electrical circuits. The interconnecting wires are electrically isolated by dielectric layers. BEOL process technologies may employ copper to form BEOL interconnects. Copper interconnects are characterized by relatively low electrical resistance in the BEOL interconnect structures, resulting in improved conduction and higher performance. Defects in copper interconnect structures such as voids, recesses and/or under-fill can result in loss of line yield, circuit failures, and wafer scrap. Attempts to address such defects have included the stripping of all layers, including interconnect metal and dielectric layers, and redepositing and patterning the same. Patterning steps can become challenging at advanced nodes.

To mitigate electromigration in BEOL copper interconnect structures, a capping layer is typically formed over the BEOL copper wiring. The capping layer is formed with a material that serves to inhibit diffusion, oxidation, and/or electromigration from the top surface of the copper interconnect structures and/or to prevent oxidation of the copper interconnect structures.

Figure 1:
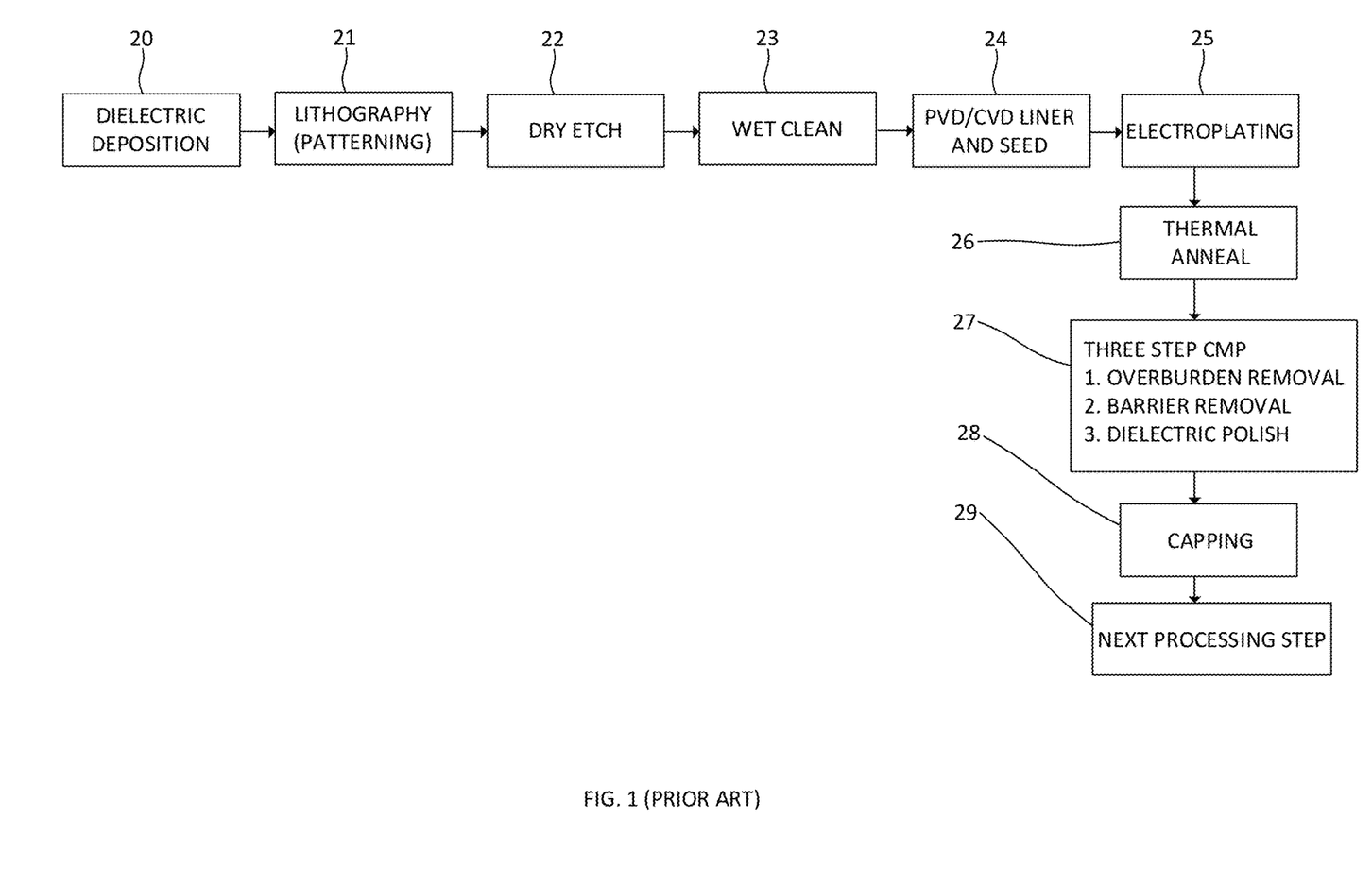
FIG. 1 is a flow diagram showing steps performed in forming metal interconnects during conventional BEOL processing.

FIG. 1 is a flow diagram showing a known BEOL process flow that follows FEOL and MOL processing. The resulting BEOL structure includes a dielectric layer and a metal interconnect structure embedded in the dielectric layer. The dielectric layer, which may include multiple layers, may be referred to as an inter-layer dielectric layer or ILD layer. Step 20 of the process flow depicted in FIG. 1 relates to deposition of an ILD layer.

Trench openings are conventionally formed in the ILD layer by using, for example, known damascene techniques. Photolithography and etching steps, as indicated in stages 21 and 22 of the flow diagram shown in FIG. 1, follow ILD layer deposition. Specifically, a photoresist (not shown) is applied over the ILD layer. The photoresist can be applied by any suitable technique, including, but not limited to coating or spin-on techniques. A mask (not shown), which is patterned with shapes defining trench openings (and possibly contact holes) to be formed, is provided over the photoresist, and the mask pattern is transferred to the photoresist using a photolithographic process, which creates recesses in the uncovered regions of the photoresist. The patterned photoresist is subsequently used to create the same pattern of recesses in the ILD dielectric layer through conventional etching typically used for forming trenches and contact holes. As indicated in FIG. 1, a dry etch (for example, a reactive ion etch) may be employed in step 22 to form such trenches and contact holes. The etching selectively removes a portion of the ILD layer. The depth(s) of the trench openings can be controlled by using a timed etching process. Alternatively, the dielectric layer may include multiple layers that may be selectively etched. In such a case, the etch process selectively removes the upper layer(s) of the ILD layer, stopping at a lower layer thereof that forms an etch stop. After formation of the trench openings, the photoresist may be stripped by ashing or other suitable process from the ILD layer. The resulting structure may be subjected to a wet clean (step 23).

A further stage 24 in the fabrication process includes depositing a conformal layer of liner material. The conformal layer of liner material lines the sidewall and bottom surfaces of the trenches or other openings within the ILD layer. The liner material may include one or more thin layers of material such as, for example, tantalum (Ta), tantalum nitride (TaN), titanium nitride (TiN), cobalt (Co), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB) which are suitable for the given application. The thin liner serves as a barrier diffusion layer and adhesion layer. The conformal layer of liner material is deposited using known techniques such as CVD, ALD, or PVD. A thin conformal Cu seed layer can be deposited over the surface of the liner using PVD in stage 24, followed by the electroplating of Cu to fill the damascene (or dual damascene) openings in the ILD layer in stage 25. A thermal anneal stage 26 follows electroplating.

The overburden liner, seed, and metallization materials are then removed by performing a three step chemical mechanical polishing process (CMP) to planarize the surface of the semiconductor structure down to the ILD layer in stage 27 of the BEOL process flow. A metal cap layer is selectively deposited on the exposed metal interconnect layer within the trenches in stage 28 of the process. For example, metals such as cobalt, ruthenium or manganese may be deposited using chemical vapor deposition or atomic layer deposition to form the cap layers. Post-deposition cleaning may be required to ensure there is no leakage or degradation resulting from possible metal residues on the resulting structure. Stage 29 includes such cleaning and/or other steps that may be performed subsequent to capping.

BRIEF SUMMARY

Techniques are provided for reworking interconnect metallization structures to address potential problems relating to possible voids, under-fill and recess defects in BEOL metal interconnects.

In one aspect, an exemplary method for reworking metal interconnect structures includes obtaining a structure including a dielectric layer having a top surface and a plurality of open-ended trenches extending within the dielectric layer. Each of the trenches includes opposing sidewalls and a first metal interconnect layer within the trenches, the first metal interconnect layer including voids therein. A first diffusion barrier liner is between the first metal interconnect layer and the dielectric layer. The first metal interconnect layer within the trenches is etched to open the voids therein and then reflowed, thereby forming a bottom interconnect layer portion within each of the trenches. A second diffusion barrier liner is formed on the opposing sidewalls of the trenches above the bottom interconnect layer portions. A second metal interconnect layer is deposited within the trenches on the bottom interconnect layer portions and between opposing portions of the second diffusion barrier liner. The second metal interconnect layer is then planarized.

A further method for reworking metal interconnect structures includes obtaining a structure including a dielectric layer, a plurality of open-ended trenches extending within the dielectric layer, each of the trenches having opposing sidewalls, a first metal interconnect layer within the trenches, and a first diffusion barrier liner between the first metal interconnect layer and the dielectric layer. The method further includes etching the first metal interconnect layer and then reflowing the first metal interconnect layer, thereby forming a bottom interconnect layer portion within each of the trenches. A second metal interconnect layer is deposited within the trenches on the bottom interconnect layer portions and between the opposing sidewalls of the trenches. The second metal interconnect layer is then planarized.

In another aspect, an interconnect structure is provided that includes a dielectric layer having a top surface and a plurality of open-ended trenches extending within the dielectric layer and downwardly with respect to the top surface. Each of the trenches includes opposing sidewalls, bottom portions, and top portions. Metal interconnects are within the top and bottom portions of the trenches. A first diffusion barrier liner lines the sidewalls of the bottom portions of the trenches and is positioned between the metal interconnects and the dielectric layer. A second diffusion barrier lines the sidewalls of the top portions of the trenches and is positioned between the metal interconnects and the dielectric layer.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Defects in metal interconnects addressed;
Improved line yield/less wafer scrap;
Additional patterning during rework not required;
Process usable on any interconnect levels and before or after planarization steps.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present inventions will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 2A:
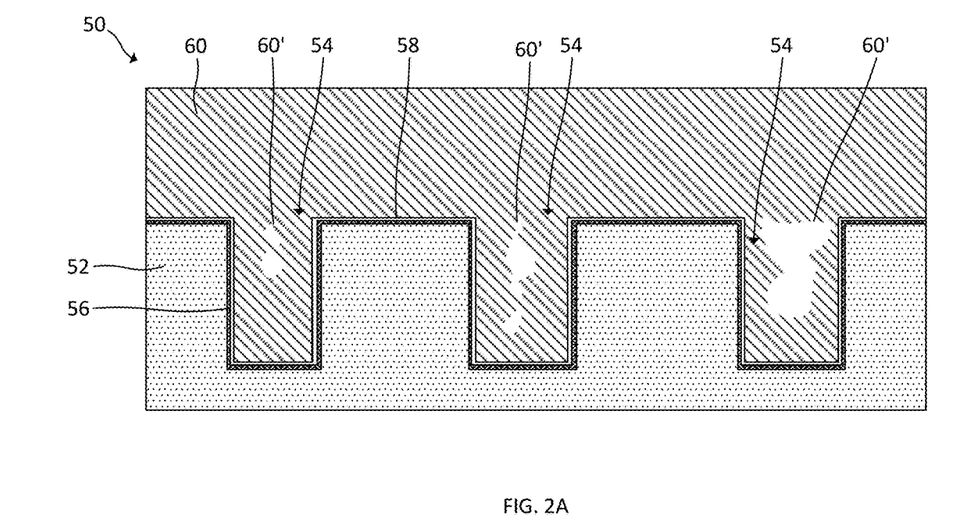
FIG. 2A is a schematic, cross-sectional view showing voids formed in metal interconnects.

Referring to FIG. 2A, a BEOL interconnect structure 50 includes a dielectric layer 52 having trenches 54 formed therein. Trench widths may, for example, be between 24 nm and 10 μm. Trench depths can be between 24 nm and 10 μm. Such dimensions should be considered exemplary as opposed to limiting. The opposing sidewalls of the trenches 54 extend vertically downwardly from the top surface of the dielectric layer. The trench sidewalls may or may not be parallel to each other. The structure 50 further includes a diffusion barrier 56 and an adhesion layer 58 that line the surfaces of the dielectric layer, including the bottom walls and sidewalls of the trenches 54. An interconnect metal layer 60 fills the trenches 54 and extends over the top surface of the dielectric layer 52. As discussed above, the interconnect metal layer 60 may include voids 60'. The top surfaces of the interconnect metal layer may further have convex or concave configurations that become increasingly problematic at advanced nodes (e.g. 7 nm nodes). A BEOL interconnect structure 50 as shown in FIG. 2A may be obtained following electroplating interconnect metal on the structure (step 25 of the process flows depicted in FIGS. 1 and 3). As further schematically illustrated in FIG. 2B, the trenches 54 may be under-filled by various amounts due to the loss of interconnect metal during processing. Defects resulting from under-fill, non-planar surfaces and/or internal voids can negatively affect performance of a circuit.

Figure 3:
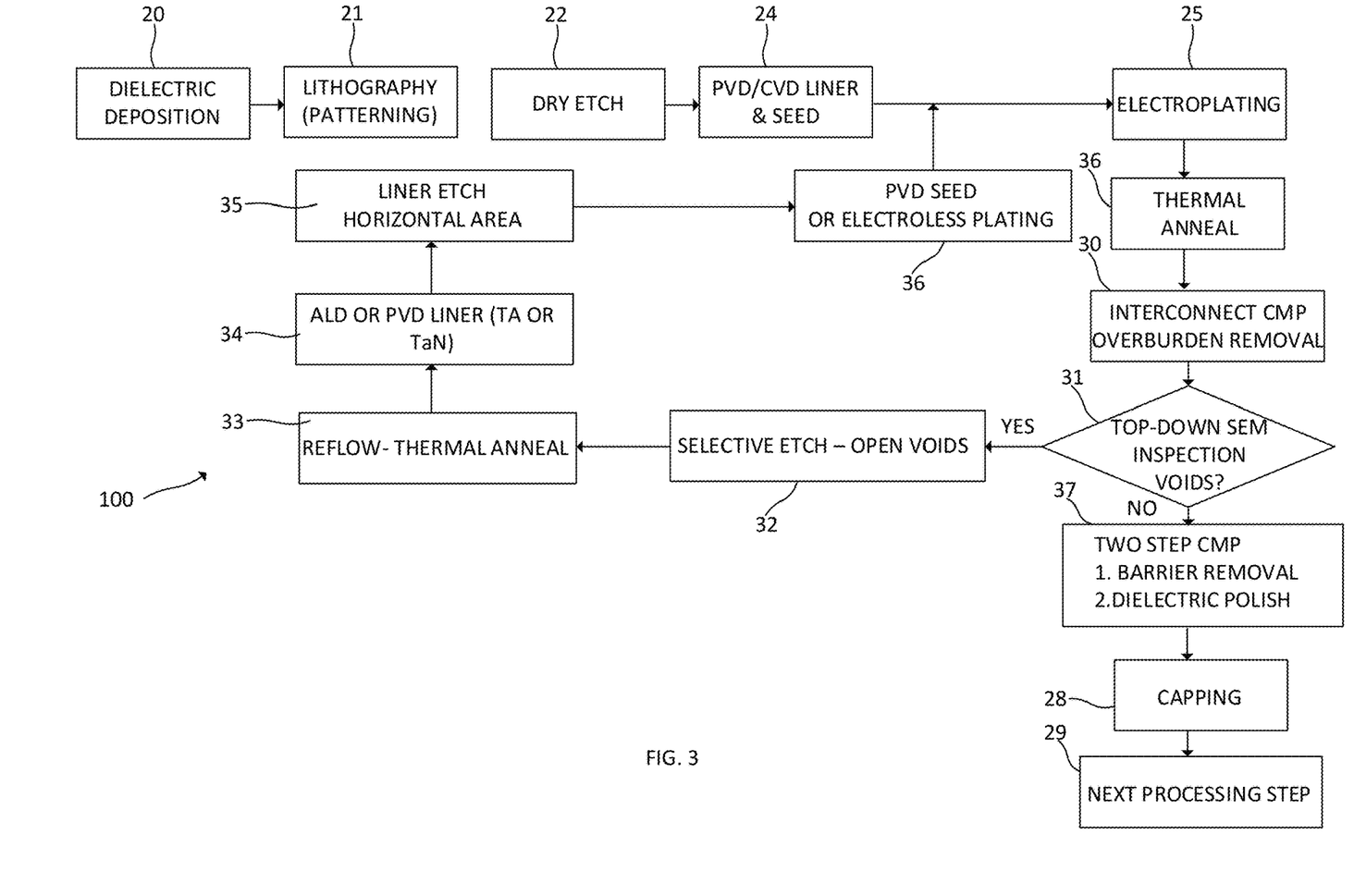
FIG. 3 is a is a flow diagram showing steps performed in forming metal interconnects during BEOL processing in accordance with a first exemplary embodiment of the invention.

An exemplary process flow 100 for fabricating and reworking BEOL metal interconnects is provided in FIG. 3, starting with the deposition of a dielectric layer over FEOL and MOL layers in step 20 as discussed above with respect to FIG. 1. The FEOL layer comprises a CMOS device layer in one or more embodiments. The exemplary process flow allows voids, under-fill, and recess defects that may be formed in the metal interconnect layer to be addressed, as discussed below. The dielectric (ILD) layer may be deposited using methods well known in the art. The dielectric (ILD) layer deposited in step 20 (layer 52 in FIGS. 4-9) surrounds and electrically insulates interconnect wiring that is formed later in the process. The ILD layer may contain any suitable dielectric material(s) including but not limited to: silicon dioxide, silicon nitride, other types of silicon-based, low-k dielectrics (e.g., k less than about 4.0), porous dielectrics, or known ULK (ultra-low-k) dielectric materials (with k less than about 2.5). The ILD layer may be deposited using known deposition techniques, such as, for example, ALD (atomic layer deposition), CVD (chemical vapor deposition), PECVD (plasma-enhanced CVD), PVD (physical vapor deposition), or spin-on deposition. SiLK® thermosetting polymer may, for example, be applied by spin coating and is planarized following curing. Chemical vapor deposition (CVD), including plasma-enhanced CVD, is a further technique often used for the deposition of low-k dielectric materials such as porous siliconoxycarbonitride (SiOCN). Low-k organic polymers having dielectric constants below 2.5 may alternatively be employed to form the dielectric layer. Low-k ILDs are known to the art for use with copper and copper compound interconnects. The process disclosed herein may alternatively include ILD material having a dielectric constant that is greater than 2.5 for some nodes. The chosen dielectric material is resistant to subsequent selective etching of cap metal and chemical mechanical planarization (CMP), as described below. The ILD layer has a thickness suitable for the specific application requirements. In some embodiments, ILD layer thickness is between thirty and two hundred nanometers (30-200 nm). Such a range should be considered exemplary and not limiting.

The ILD layer is patterned and subjected to dry etching in steps 21 and 22, respectively, to obtain open trenches. Conventional lithography and etching processes may be employed to pattern the structure, it being appreciated that such processes continue to be developed in the industry and that etching processes developed in the future may have application to the techniques disclosed herein. A wet cleaning step may follow dry etching. A diffusion barrier liner (layer 56 in FIGS. 4-9) and an adhesion layer (layer 58 in FIGS. 4-9) are deposited sequentially on the resulting structure in step 24. Exemplary deposition techniques and materials for the diffusion barrier, adhesion layer, and seed layer are discussed above with respect to FIG. 1. The diffusion barrier liner includes multiple layers in some embodiments. In one exemplary embodiment, a tantalum (Ta) liner is conformally deposited on the structure for use as a diffusion barrier. The Ta liner may have a thickness of about ten to sixty Angstroms (10-60A). A relatively thick diffusion barrier may be employed in embodiments for interconnect metals such as copper while thinner diffusion barriers may be employed for structures including cobalt interconnects. The diffusion barrier liner can be deposited using any suitable deposition process, for example, atomic layer deposition or sputtering. A layer of cobalt (Co) or tantalum nitride (TaN) is deposited on the Ta barrier liner and functions as the adhesion layer in some embodiments. Such materials may be deposited using physical vapor deposition or chemical vapor deposition. Radio-frequency enhanced physical vapor deposition (RF PVD) is a known technique for depositing thin metal films, and may be employed for depositing the diffusion barrier and adhesion layers. A metal seed layer is deposited on the adhesion layer. In embodiments wherein the interconnect metal is copper, a copper seed layer may be deposited on the adhesion layer.

Figure 2B:
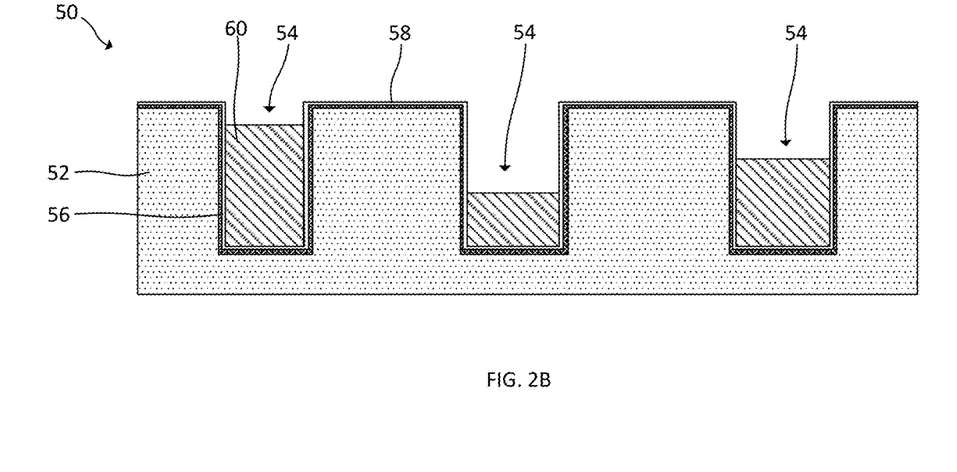
FIG. 2B is a schematic, cross-sectional view showing the structure of FIG. 2A following thermal anneal.

Metal interconnect material is deposited on the structure in step 25 and directly contacts the seed layer. The resulting metal layer includes copper (Cu), and consists essentially of elemental copper in some embodiments. Copper alloys such as Cu(Al) may alternatively be employed as metal interconnect layer material. Copper may be deposited using, for example, chemical vapor deposition, physical vapor deposition plus reflow, or electrochemical deposition (e.g. electroplating) as used in the copper damascene process. In other exemplary embodiments, cobalt is deposited to form the metal interconnect layer. The metal interconnect layer comprises the metal layer and the underlying seed layer. The barrier layer deposited prior to the copper fill helps prevent the diffusion of interconnect metal into the surrounding dielectric material. The interconnect metal fills the trenches formed in the ILD layer, though possibly containing unwanted voids. A thermal annealing process (step 26) is performed to increase the grain size of the deposited interconnect metal in the trenches. Chemical mechanical planarization (CMP) (step 30) follows interconnect metal deposition and thermal annealing to remove metal overburden. While ideally the top surfaces of each metal interconnect are substantially coplanar with the top surface of the ILD layer (or barrier layer) and the metal interconnects are free of voids, this in fact may not be the case as schematically illustrated in FIGS. 2A and 2B. In other words, some or all metal interconnects may include voids, some trenches may be under-filled, and/or the top surfaces of the metal interconnects may be convex or concave ("dished").

A scanning electron microscope (SEM) or other optical or electrical inspection vehicle(s) may be employed for a top-down inspection of the metal interconnect layer in step 31 following removal of the metal overburden. Optical critical dimension (OCD) technology or electrical resistance testing may alternatively or additionally be employed for interconnect metal inspection. Such an inspection may or may not reveal the presence of unwanted voids or recesses within the metal interconnect layer. In the absence of unwanted defects, two-step chemical mechanical planarization is continued in step 37 to remove portions of the layers forming the diffusion barrier and adhesion layer from the top surface of the dielectric (ILD) layer and polishing of the top surface of the ILD layer. Steps 28 and 29, as discussed with respect to FIG. 1, are then performed.

In some embodiments, a cap layer of a low resistivity material capable of forming an alloy with copper is deposited on the structure in step 28. Exemplary capping materials for a copper interconnect structure include but are not limited to cobalt, ruthenium, manganese, nickel, aluminum and titanium. Cobalt may, for example, be deposited using a metal-organic precursor in a CVD process at a temperature range of 150-200° C. Ruthenium may be deposited using thermal CVD at 1.5 Torr and at a process temperature of 250-350° C. As the deposition of the metal cap layer may be selective or non-selective, any suitable process for forming such a layer on the structure may be employed. Exemplary processes include physical vapor deposition (PVD), chemical vapor deposition (CVD), atomic layer deposition (ALD) and electroless deposition techniques. Deposition times are controlled to obtain a cap layer of desired thickness. In embodiments including copper interconnects, the thickness of the cap layer is at least sufficient to form an effective copper alloy cap layer on the metal interconnect layer when further processed. In embodiments wherein the interconnect metal is cobalt, the capping layer deposited in step 28 can be formed from metals selected from the group consisting of ruthenium (Ru), rhodium (Rh), osmium (Os), iridium (Ir), molybdenum (Mo) and alloys thereof. Metal cap layers having thicknesses greater than three nanometers (3 nm) are provided on the formerly exposed top surfaces of the cobalt layer. A barrier layer for cobalt interconnect structures may comprise materials such as titanium nitride having a thickness of 15-20 Å in some embodiments as cobalt does not diffuse as readily into dielectric materials as some other metals such as copper. Other barrier materials that may be used in some embodiments include TaN and WN. A cobalt interconnect layer may be deposited using chemical vapor deposition techniques.

Following deposition of the metal cap layer, the structure is subjected to further processing steps 29. The resulting structure may include a dielectric (ILD) layer including plurality of open-ended trenches, each trench containing a barrier layer, a metal interconnect layer, and a cap layer that provides effective resistance to electromigration. Additional BEOL layers may be formed if necessary to complete the interconnect structure.

Figures 4, 5:
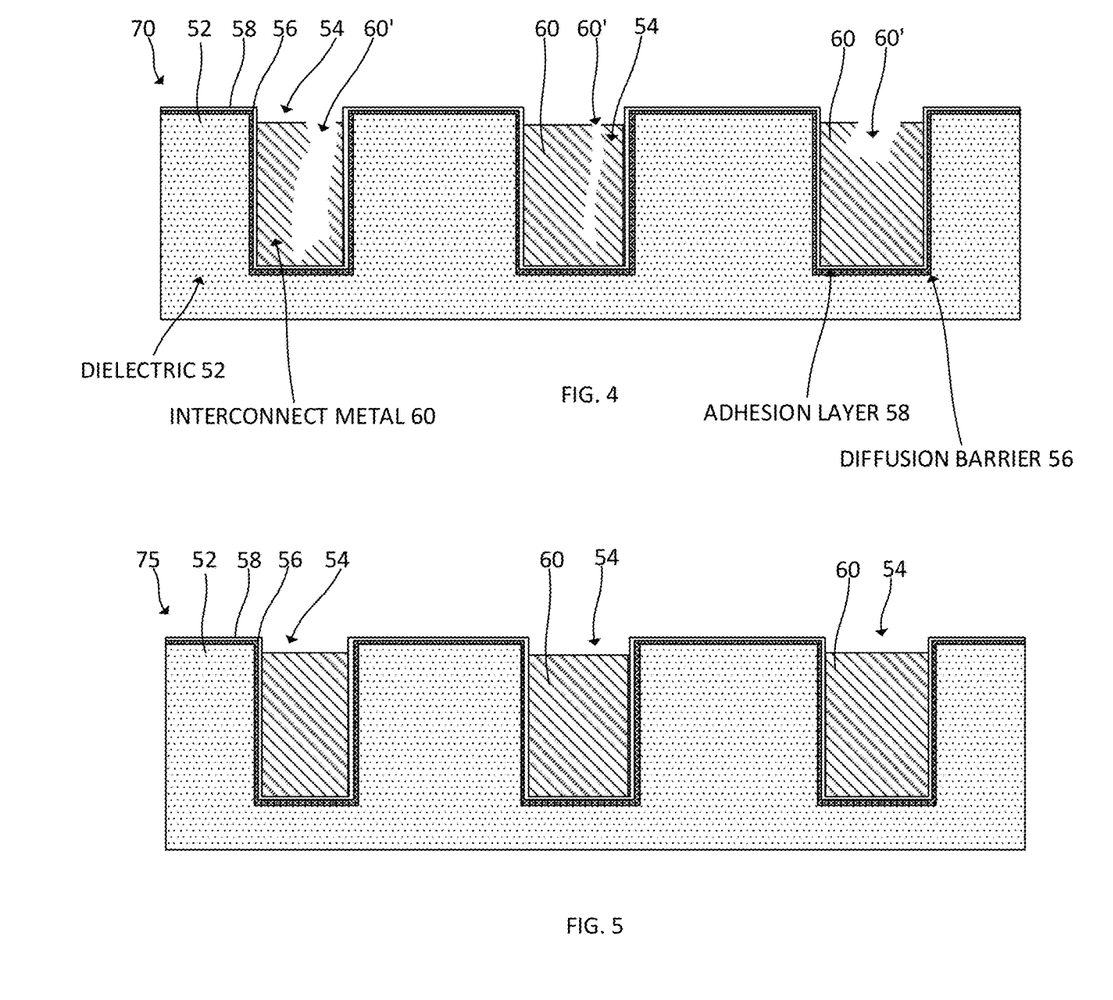
FIG. 4 is a schematic, cross-sectional view of a BEOL layer following the selective etching of interconnect metal to open voids therein.
FIG. 5 is a schematic, cross-sectional view thereof following thermal processing to cause reflow of the interconnect metal.

A rework process including steps 32-36 is followed in the exemplary process flow 100 if interconnect defects are detected in the inspection step 31. FIGS. 4-9 schematically illustrate an exemplary process flow. Step 32 includes a selective etch of the interconnect metal. In some embodiments, a selective Cu/CuO etch is conducted to remove metal (copper) oxide and to open voids 60' in the metal interconnect layer 60. A timed wet etch may, for example, be employed for isotropically removing copper oxide and copper. As known in the art, alpha amino acid complexants including, for example, alanine, are suitable for selectively removing copper oxide and copper. Effective copper oxide removal has also been demonstrated using ammonia plasma and hydrogen plasma. FIG. 4 schematically illustrates an exemplary structure 70 wherein voids 60' within the metal interconnect layer 60 are exposed following the selective etch. The etch is timed such that interconnect metal remains in the trenches 54 and covers portions of the adhesion and barrier layers 58, 56 within the trenches.

The structure 70 is thermally annealed in step 33 to cause reflow of the remaining interconnect metal 60 within the trenches 54. The reflow process can be performed under any conditions that cause the interconnect metal to reflow. In some embodiments including copper interconnect metal, the reflow process occurs at elevated temperatures from about 100° C. to about 450° C. for less than two hours. The time required for interconnect metal reflow depends on factors such as the temperature at which the step is conducted and the amount and type(s) of interconnect metal within the trenches. The environment employed in the reflow process could comprise a vacuum. The metal reflow is driven by capillary forces and causes substantially void-free metal interconnect metal to accumulate at the bottom portions of the trenches. As shown in FIG. 5, the resulting structure 75 includes trenches 54 that are partially filled with interconnect metal. The open spaces formed within the upper portions of the trenches above the top surfaces of the reflowed interconnect metal may or may not have the same dimensions. Ruthenium tantalum nitride (RuTaN) barrier layers deposited using sputtering or other suitable techniques may be employed in embodiments wherein copper is reflowed. The spaces in the upper portions of the trenches 54, being essentially devoid of interconnect metal, include exposed sidewalls. The diffusion barrier and adhesion layers 56, 58 adjoin both the remaining interconnect metal in the bottom portions of the trenches as well as the open spaces in the upper portions of the trenches, as illustrated in FIG. 5.

Figure 6:
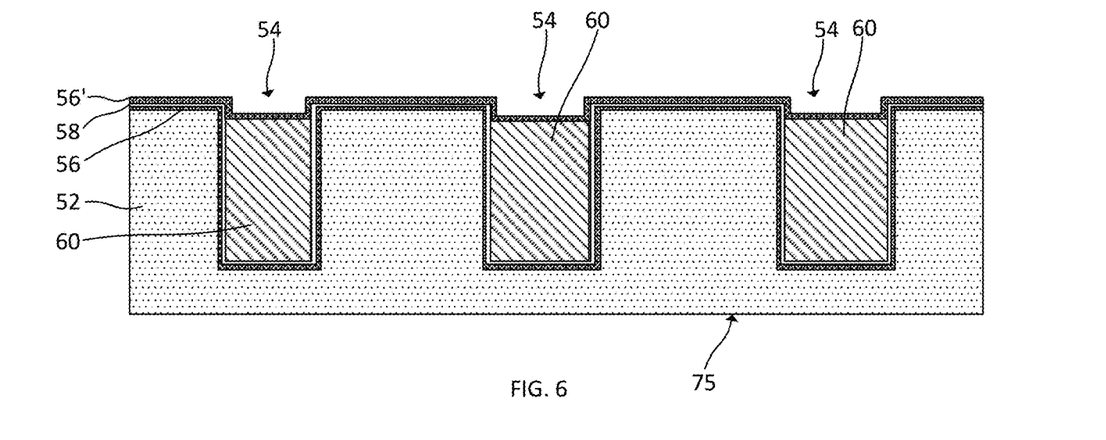
FIG. 6 is a schematic, cross-sectional view thereof following deposition of a liner.

A second liner 56' is conformally deposited on the structure 75 to obtain a structure as exemplified in FIG. 6. The second liner 56' extends within the trenches 54 and adjoins the trench sidewalls and the top surfaces of the interconnect metal layer 60. The second liner 56' may or may not have the same composition as the liner 56 forming the diffusion barrier that adjoins the ILD layer 52. The second liner 56' includes of tantalum (Ta), tantalum nitride (TaN), RuTaN, or other diffusion barrier material. The second liner 56' can be deposited using physical vapor deposition (PVD) or atomic layer deposition (ALD) and may have a thickness in the range of 10-60 Å.

Figure 7:
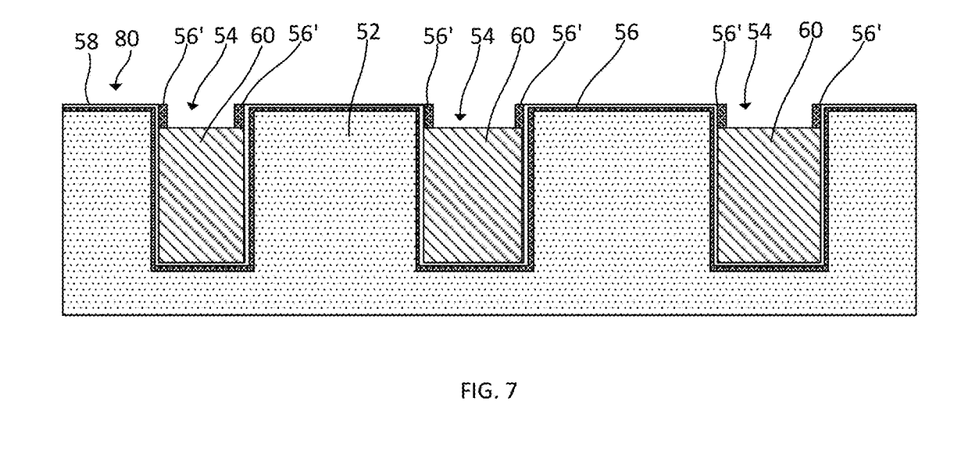
FIG. 7 is a schematic, cross-sectional view thereof following removal of horizontal portions of the liner.

The portions of the second liner 56' extending horizontally over the top surfaces of the structure 75 are removed, leaving vertically extending portions of the second liner adjoining the sidewalls of the trenches 54. The remaining vertical portions of the second liner 56' form vertical spacers that extend from the trench openings to the top surfaces of the metal interconnect layer 60. FIG. 7 shows an exemplary structure 80 obtained following etching of the horizontal portions of the second liner 56' (step 35 of FIG. 3). The second liner 56' facilitates re-metallization within the open spaces within the trenches 54 using steps as discussed below. The selective etch to open voids in the interconnect metal may damage the previously formed liner and adhesion layers 56, 58. The deposition of a second liner 56' helps ensure an effective barrier layer is present during subsequent electroplating.

Figure 8:
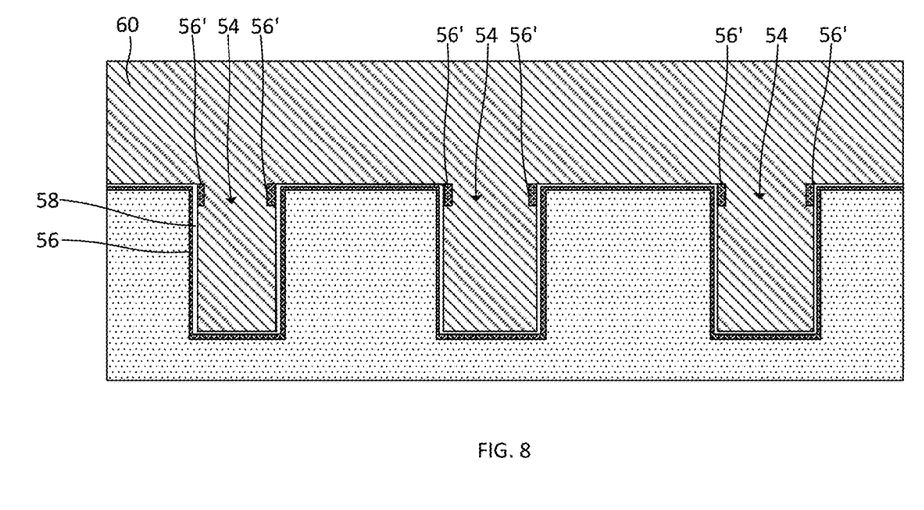
FIG. 8 is a schematic, cross-sectional view thereof following deposition of additional interconnect metal.

A second seed layer (not shown) may be deposited on the structure 80 (step 36 in FIG. 3) following removal of the horizontal portions of the second liner 56'. The second seed layer may be a copper seed layer deposited using physical vapor deposition (PVD) or other suitable process. Seed layer deposition is followed by deposition of interconnect metal, repeating step 25 as shown in FIG. 3. Deposition of interconnect metal by electroplating the metal is preferred in some embodiments. The newly deposited interconnect metal fills the open spaces within the upper portions of the trenches 54 above the top surfaces of the existing interconnect metal. The initial and subsequently deposited metal layers form integral metal interconnect layers within the trenches. Excess metal interconnect material (overburden) deposited by electroplating extends outside the trenches and on the top surfaces of the structure following electroplating, as schematically illustrated in FIG. 8. Repeating step 26, the structure is thermally annealed following deposition of the additional metal interconnect material in the trench spaces.

Alternatively, interconnect metal can be deposited within the trenches 54 by electroless plating during the re-metallization process. Electroless copper deposition within trenches can be conducted without prior deposition of a seed layer. The use of electroless plating may obviate the need for subsequent electroplating in some embodiments. Interconnect metal is, however, electroplated over interconnect metal deposited by electroless plating in some embodiments.

Figure 9:
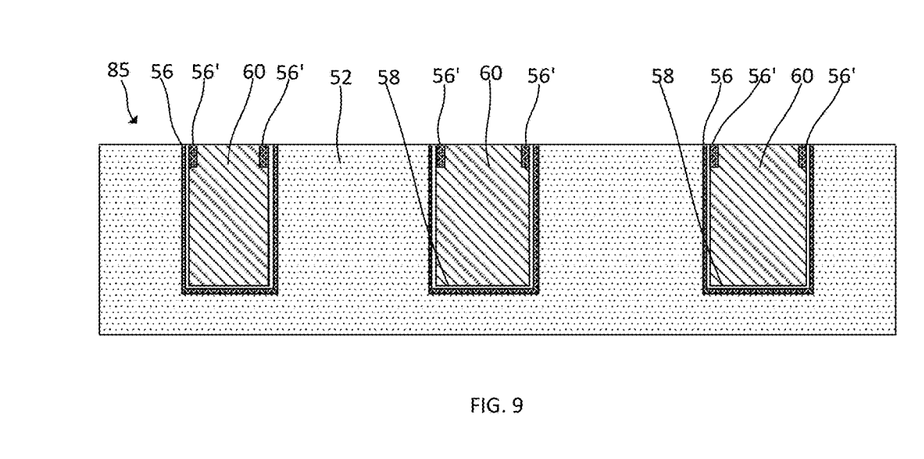
FIG. 9 is a schematic, cross-sectional view thereof following planarization.

The structure is subjected to CMP (step 27) to remove the metal overburden and then optionally re-inspected in step 31. If the interconnect metal defects have been satisfactorily addressed, a two-step CMP is performed to remove diffusion barrier liner material and adhesion layer from the structure top surface of the dielectric (ILD) layer 52 followed by dielectric polishing. A BEOL interconnect structure 85 as shown in FIG. 9 is accordingly obtained. If voids are detected during re-inspection, they are likely to be confined to the newly deposited interconnect metal in the upper portions of the trenches. The previously deposited interconnect metal, having been subjected to void opening and reflow, should be essentially void-free at this stage. Subsequent reworking of the metal interconnects, if necessary, may involve etching less metal than the previous rework.

Interconnect structures as described herein facilitate adoption of scaled down technology nodes. The processes described herein may, if desired, employ currently existing conformal metal deposition and metal etch processes, allowing their implementation within existing facilities using existing tooling. It will be appreciated that new deposition and etch processes having application to the processes discussed herein may be developed and adopted.

Figure 10:
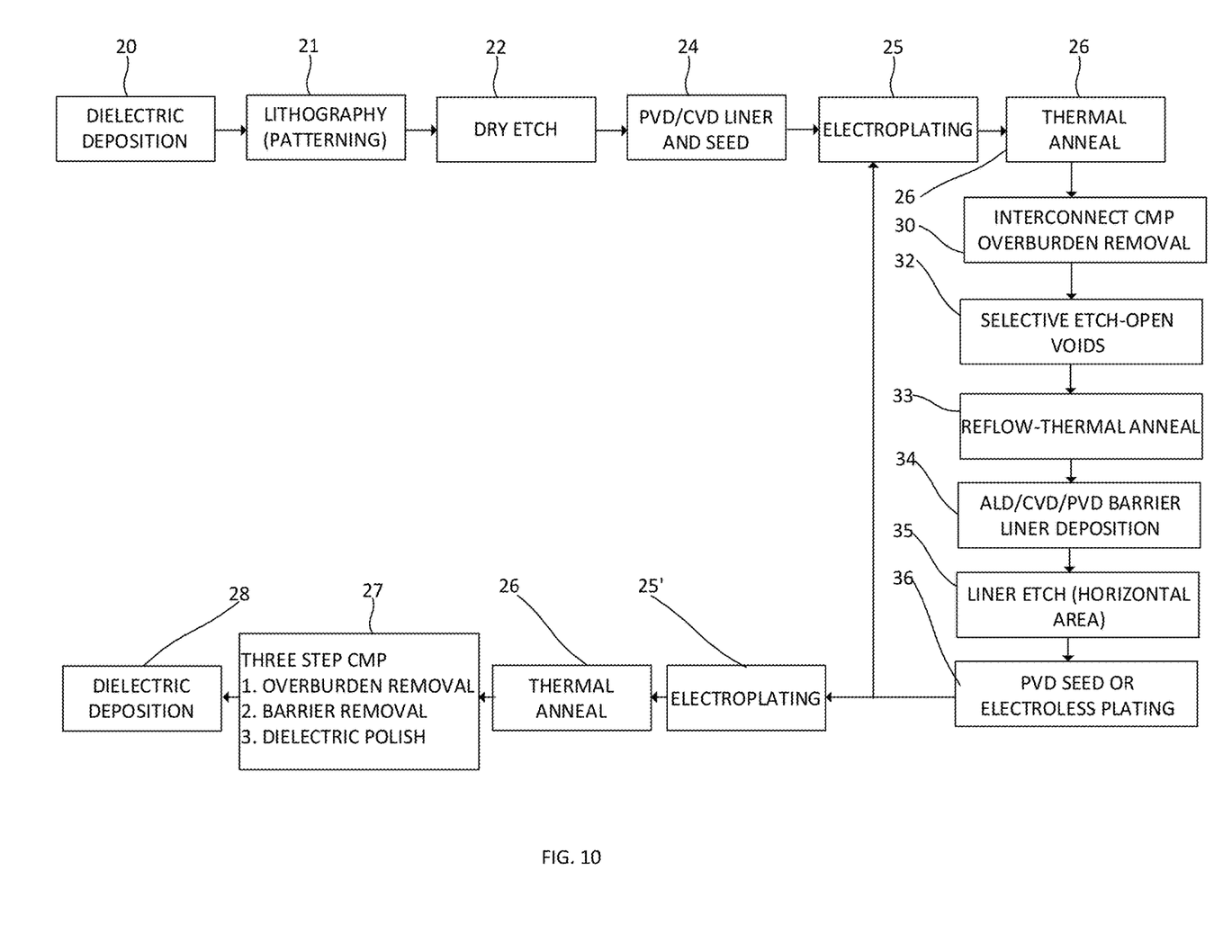
FIG. 10 is a is a flow diagram showing steps performed in forming metal interconnects during BEOL processing in accordance with a second exemplary embodiment of the invention.

A second exemplary process flow 110 is depicted in FIG. 10. The same reference numerals employed in FIG. 3 are used therein to indicate similar process steps or stages. The second exemplary process flow includes the same initial sequence of steps 20, 21, 22, 24, 25, 26, 30 employed in the process flow 100 described above. There is no inspection of the interconnect metal in the trenches following interconnect metal CMP/overburden removal in step 30. In some embodiments, it is assumed that the metal interconnects formed during the initial electroplating process or a subsequent electroplating process following a rework do indeed include defects such as voids. Accordingly, originally deposited or subsequently deposited interconnect metal is selectively etched following CMP to open voids therein in step 32. The selective etch is followed sequentially by reflow, conformal barrier liner deposition, and etching of the liner in steps 33, 34, 35. An interconnect metal seed layer is then deposited or electroless plating of interconnect metal is conducted in step 37. A final electroplating step 25' or a non-final electroplating step 25 follows metal seed deposition or electroless plating. In some embodiments, reworking of the metal interconnects involves only one re-metallization stage and a final electroplating step 25' is performed after only one reflow of interconnect metal. In other embodiments, more than one re-metallization stage is deemed necessary. At least one further non-final electroplating step 25, as shown in FIG. 10, is accordingly performed, followed by steps 30, 32, 33, 34, 35 and 36 and a final electroplating step 25'. Each subsequent re-metallization stage may require a selective etch of shorter duration to open voids as new voids are only potentially expected in newly electroplated interconnect metal in the top portions of the trenches. The interconnect metal remaining in the trenches following each reflow may accordingly be greater than that remaining in the trenches following the preceding reflow. Each successive interconnect rework sequence may accordingly involve a shorter etch and the electroplating of less interconnect metal within the trenches.

The final electroplating step 25' is followed by thermal anneal, three-step CMP and capping (steps 26, 27, 28) as discussed above with respect to FIGS. 1 and/or 3. A structure 85 as shown in FIG. 9 may be obtained using the process 110 shown in FIG. 10.

Figure 11:
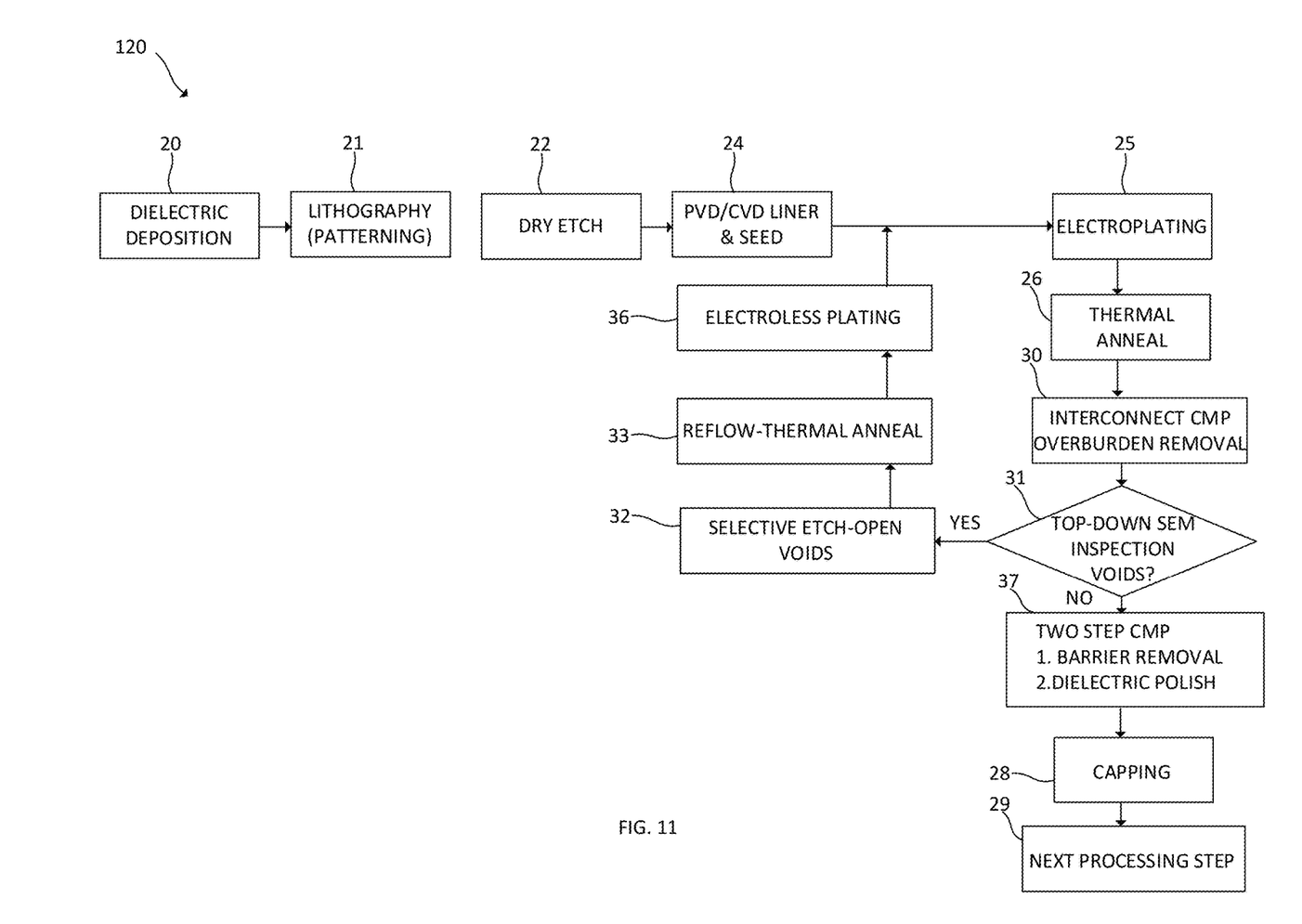
FIG. 11 is a is a flow diagram showing steps performed in forming metal interconnects during BEOL processing in accordance with a second exemplary embodiment of the invention.

A further alternative process flow 120 is illustrated in FIG. 11. The same reference numerals used in FIGS. 1, 3 and/or 10 are employed to designate similar steps used in other process flows. The alternative process flow 120 includes a selective etch of interconnect metal to open voids therein followed by reflow of the interconnect metal that remains in the trenches. It does not, however, require barrier re-deposition (layer 56' in FIGS. 7-9) following reflow. As discussed above, by using electroless plating to deposit interconnect metal within the trenches, barrier liner re-deposition is not required to facilitate metal growth on the trench sidewalls. New interconnect metal grows from bottom to top on the top surface of reflowed interconnect metal and fills the open spaces in the upper portions of the trenches. Electroless plating (step 36) is optionally followed by electroplating in step 25 and thermal anneal in step 26. Interconnect metal (overburden) CMP in step 30 allows the optional re-inspection of the interconnect metal for voids in step 31. In the absence of voids, two-step CMP, capping, and further processing steps are employed to complete the wired device(s).

FIGS. 3, 10 and 11, as discussed above, depict exemplary processing steps/stages in the fabrication of exemplary structures including metal interconnects. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, exemplary methods for reworking metal interconnect structures are provided for reducing defects and enhancing line yield. As discussed above, BEOL structures include a dielectric layer 52 having a top surface and a plurality of open-ended trenches 54 extending within the dielectric layer. Each of the trenches has opposing sidewalls that may or may not be parallel. Trenches may, for example, have relatively wide top openings. A first metal interconnect layer 60 within the trenches includes voids 60' therein, as schematically illustrated in FIG. 2A. A first diffusion barrier liner 56 is between the first metal interconnect layer 60 and the dielectric layer 52. In one exemplary method, the first metal interconnect layer within the trenches is etched to open the voids within the first metal interconnect layer, as schematically illustrated in FIG. 4 and then subjected to thermal annealing to cause reflow of the metal. Bottom interconnect layer portions are formed from the reflowed metal within each of the trenches as the metal flows to the bottoms of the trenches 54 during thermal anneal. FIG. 5 shows and exemplary structure 75 following reflow. A second diffusion barrier liner 56' is formed over the opposing sidewalls of the trenches and extends vertically above the bottom interconnect layer portions, as shown in FIG. 7. A second metal interconnect layer is deposited within the trenches 54 on the bottom interconnect layer portions and between opposing portions of the second diffusion barrier liner 56' as shown in FIG. 8. The second metal interconnect layer is the planarized to obtain a structure 85 as shown in FIG. 9. The first metal interconnect layer may be planarized prior to etching and prior to an optional inspection for voids therein. The method further including depositing protective metal cap layers on the second metal interconnect layer following planarization thereof, as indicated by step 28 in FIG. 3. The second diffusion barrier liner may be formed by depositing a conformal layer of barrier material over the dielectric layer, the bottom metal interconnect layer portions, and portions of the sidewalls of the trenches as schematically illustrated in FIG. 6. Selected portions of the conformal layer of barrier material are removed above the dielectric layer and the interconnect metal in the bottom portions of the trenches to obtain a structure 80 as shown in FIG. 7.

A second exemplary method, as shown the flow diagram in FIG. 11, does not include forming a second diffusion barrier liner. The first metal interconnect layer 60 is reflowed subsequent to etching, thereby forming a bottom interconnect layer portion within each of the trenches. The second metal interconnect layer is deposited on the bottom interconnect layer portions and between the opposing sidewalls of the trenches and then planarized. If the first metal interconnect layer contains voids, etching the first metal interconnect layer opens one or more of the voids. The second metal interconnect layer further may be deposited using electroless plating of an interconnect metal within the trenches, which does not require barrier liner redeposition. Electroplating further interconnect metal may following the electroless plating of the interconnect metal.

An interconnect structure in accordance with the principles expressed herein includes a dielectric layer 52 having a top surface and a plurality of open-ended trenches 54 extending within the dielectric layer and downwardly with respect to the top surface. Metal interconnects 60 occupy the top and bottom portions of the trenches. A first diffusion barrier liner 56 lines the sidewalls of the bottom portions of the trenches and is positioned between the metal interconnects and the dielectric layer. A second diffusion barrier 56' lines the sidewalls of the top portions of the trenches and is positioned between the metal interconnects and the dielectric layer. The second diffusion barrier 56' is further positioned between portions of the first diffusion barrier liner 56 and the metal interconnects 60. An exemplary interconnect structure 85 is schematically illustrate in FIG. 9.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that integrated circuits including the exemplary BEOL structures discussed above can be distributed in raw form (i.e., a single wafer having multiple unpackaged chips), as bare dies, in packaged form, or incorporated as parts of intermediate products or end products that benefit from having FEOL devices and interconnect structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising,"

when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation or orientation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. An interconnect structure, comprising:
   a dielectric layer having a top surface;
   a plurality of trenches extending within the dielectric layer and downwardly with respect to the top surface, each of the trenches having opposing sidewalls, bottom portions, and top portions, wherein the opposing sidewalls of the trenches are parallel over an entire depth of the trenches;
   metal interconnects within the top and bottom portions of the trenches, wherein the metal interconnects extend continuously from the top to the bottom of each trench, wherein the metal interconnects have a first width in a top interconnect portion adjacent the top trench portions and a second, larger width in a bottom interconnect portion adjacent the bottom trench portions;
   a first diffusion barrier liner lining the sidewalls of the bottom portions of the trenches and positioned between the metal interconnects and the dielectric layer, and
   a second diffusion barrier lining the sidewalls of the top portions of the trenches and positioned between the top interconnect portions of the metal interconnects and the dielectric layer, the second diffusion barrier consisting of a plurality of vertical spacers that consist only of vertical portions and that extend, respectively, from top ends that are flush with the tops of the plurality of trenches downward within the plurality of trenches to bottom ends that adjoin top surfaces of the bottom interconnect portions of the metal interconnects, wherein each of the vertical spacers, and the first diffusion barrier liner, are of a same composition comprising tantalum, tantalum nitride, or ruthenium tantalum nitride;
   wherein the second diffusion barrier is further positioned between portions of the first diffusion barrier liner and the metal interconnects;
   wherein the first diffusion barrier liner further lines the sidewalls of the top portions of the trenches and the second diffusion barrier lines only the top portions of the trenches;
   wherein the metal interconnects, the dielectric layer, and the vertical spacers have coplanar top surfaces;
   wherein the first diffusion barrier liner includes top end portions positioned, respectively, between each of the vertical spacers and the dielectric layer;
   wherein the second, larger width of the metal interconnects is equal to the first width of the metal interconnects plus twice the thickness of the vertical spacers.

2. The interconnect structure of claim 1, wherein the metal interconnects comprise copper.

3. The interconnect structure of claim 2, further including an adhesive layer over the first diffusion barrier liner.

4. The interconnect structure of claim 2, further including a cobalt or tantalum nitride adhesive layer over the first diffusion barrier liner.

5. The interconnect structure of claim 1, wherein the vertical spacers have thicknesses in the range of ten to sixty Angstroms.

6. The interconnect structure of claim 5, further including an adhesive layer between each of the vertical spacers and the first diffusion barrier liner.

7. The interconnect structure of claim 1, wherein:
   the plurality of trenches have a width ranging from 24 nm— 10 μm and a depth ranging from 24 nm— 10 μm.

* * * * *